United States Patent
Hu

[19]

[11] Patent Number: 5,901,048
[45] Date of Patent: May 4, 1999

[54] PRINTED CIRCUIT BOARD WITH CHIP COLLAR

[75] Inventor: Paul Yu-Fei Hu, Tucson, Ariz.

[73] Assignee: International Business Machines Corporation, Armonk, N.Y.

[21] Appl. No.: 08/988,941

[22] Filed: Dec. 11, 1997

[51] Int. Cl.[6] .................................................. H05K 7/20
[52] U.S. Cl. ........................ 361/783; 361/719; 439/73; 257/725
[58] Field of Search ..................................... 361/783, 820, 361/717–719, 807, 809, 812; 257/726, 727, 678, 725, 731; 439/71, 73, 331, 550, 68, 70, 72, 525, 526, 554; 174/52.4

[56] References Cited

U.S. PATENT DOCUMENTS

| | | |
|---|---|---|
| 4,144,648 | 3/1979 | Grovender ................................ 439/71 |
| 4,745,456 | 5/1988 | Clemens .................................. 439/331 |
| 4,918,513 | 4/1990 | Kurose et al. ............................ 439/73 |
| 5,015,946 | 5/1991 | Janko ...................................... 324/754 |
| 5,132,875 | 7/1992 | Plesinger ................................. 361/704 |
| 5,311,402 | 5/1994 | Kobayashi et al. ..................... 361/760 |
| 5,331,507 | 7/1994 | Kyung et al. ........................... 361/720 |
| 5,426,405 | 6/1995 | Miller et al. ............................ 257/726 |
| 5,579,212 | 11/1996 | Albano et al. .......................... 361/820 |
| 5,691,041 | 11/1997 | Frankeny et al. ........................ 439/71 |
| 5,779,488 | 7/1998 | Cluff ....................................... 439/73 |
| 5,801,929 | 9/1998 | Cheng ..................................... 361/783 |

*Primary Examiner*—Leo P. Picard
*Assistant Examiner*—John B. Vigushin
*Attorney, Agent, or Firm*—Robert B. Martin

[57] ABSTRACT

The invention relates to a printed circuit board having chips attached to the PCB. One or more of the chips has a planar collar mounted around the chip. The collar has a top and bottom planar surface without any projections. The collar extends laterally away from the edge of the chip to protect the leads electrically connecting the chip to the circuit board.

2 Claims, 2 Drawing Sheets

PRINTED CIRCUIT BOARD WITH CHIP COLLAR

FIELD OF THE INVENTION

The present invention relates to a printed circuit board having one or more chips attached to the board. The chip is provided with a protective collar which is mounted around the chip.

BACKGROUND OF THE INVENTION

In the microelectronics industry, integrated circuit chips, such as server chips, are mounted on to a printed circuit board (PCB) for packaging. The printed circuit board functions to provide power to the chips and also to distribute input/output signals between chips mounted on the circuit board. The chips communicate with the circuit board through a plurality of fragile leads that run from the body of the chip to the printed circuit board. It is desired to protect these fragile leads during the mounting of the various electrical components to the circuit board and the mounting of the circuit board to the electronic device.

In U.S. Pat. No. 5,579,212, Albano et al., discloses a cover for protecting a chip device on a PCB. The cover comprises eight compression legs and four registry legs which attach to the circuit board to hold the cover over the chip. The cover is also provided with four top holes for cooling of the chip device. Unfortunately, because the cover substantially covers the chip from the ambient air, there is an unacceptable buildup of heat during operation of the chip. Further, the plurality of legs of the cover function to collect dust and the like which interfere with the optimal operation of the chip. Lastly, the cover prevents the attachment of a heat sink to the chip to enhance cooling of the chip during operation.

It is, therefore, an object of the present invention to provide an improved PCB having a chip collar. Other objects and advantages will be apparent from the following disclosure.

SUMMARY OF THE INVENTION

The present invention relates to a printed circuit board having one or more chips attached to the PCB. One or more of the chips has a planar collar mounted around the chip. The collar has a top and bottom planar surface without any projections extending from the surface and an aperture preferably square shape extending through the collar for mounting the collar around the chip. When mounted on the chip, the collar extends laterally away from the edges of the chip to protect the leads electrically connecting the chip to the circuit board.

A more thorough disclosure of the present invention is presented in the detailed description which follows and the accompanying drawings.

DETAILED DESCRIPTION OF THE INVENTION

Figure 1:
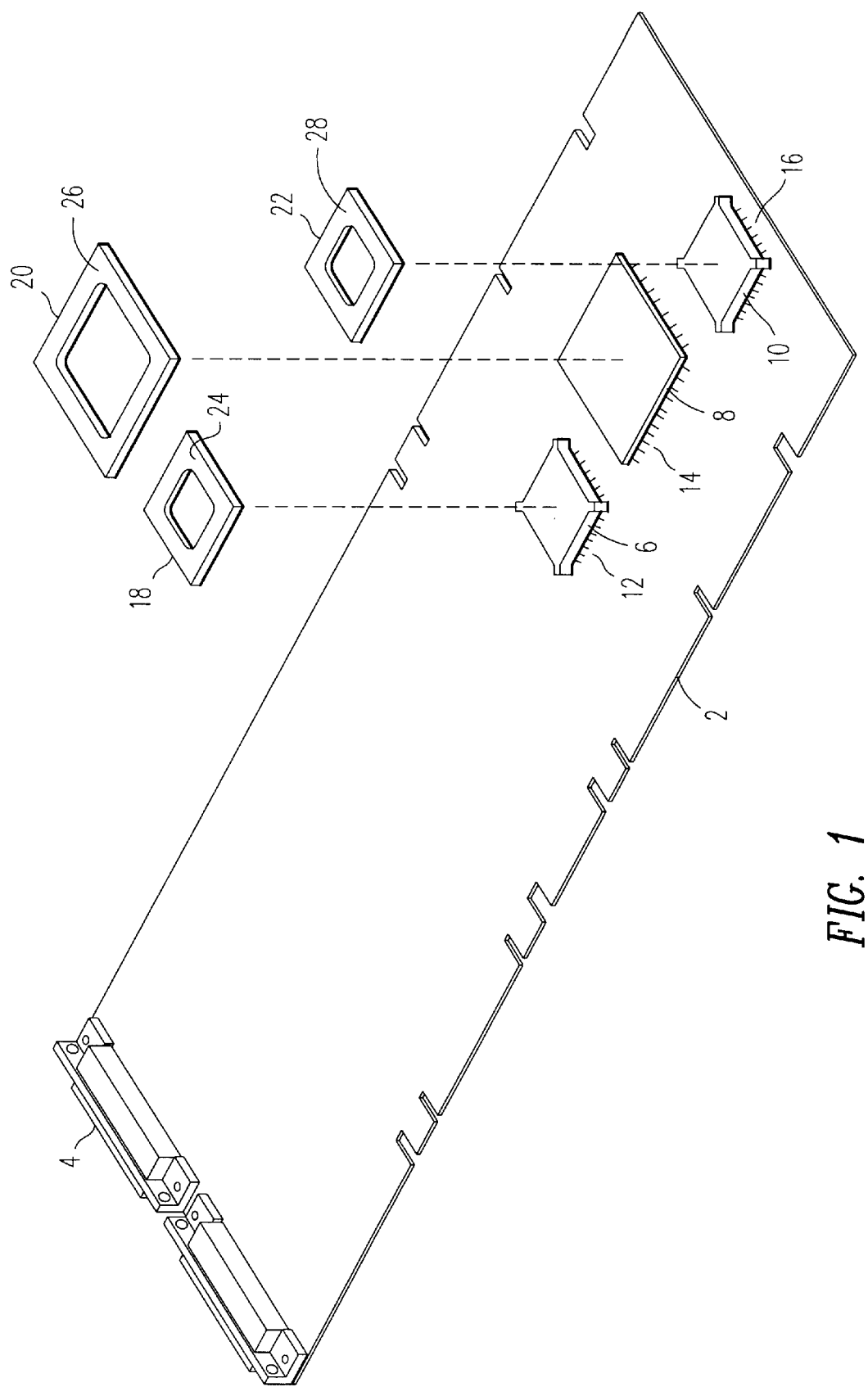
FIG. 1 is a perspective view of the PCB of the present invention.

Referring to FIG. 1, there is shown PCB 2 having connector 4 for connecting the circuit board to an electronic component. The PCB 2 is provided with integrated circuit chips 6, 8 and 10. Circuit chips 6, 8 and 10 are provided with leads 12, 14 and 16, respectively, which electrically connect the chips to the circuit board, such as by surface mounting. The circuit board is provided with a network of circuits (not shown) for providing power to the chips and distributing the input/output signals between the chips and the connector 4. Collars 18, 20 and 22 are preferably square shaped and are mounted around chips 6, 8 and 10, respectively. Preferably, the collar is frictionally mounted onto the chip so that the collar can be easily removed if reworking is desired. Alternatively, the collar can be adhered to the chip with pressure sensitive adhesive. Each collar 18, 20 and 22 is provided with a top planar surface 24, 26 and 28, and an aperture for receiving the chip. In an alternative embodiment, the aperture can be provided with an outwardly extending lip near the top surface of the collar which rests on the top surface of the chip when the collar is mounted on the chip. The collar can be suitably made of a thermoplastic polymer such as polycarbonate or a static dissipative plastic. The collars are preferably transparent to permit visual inspection of the underlying leads. The collars are mounted around the chips and extend outwardly away from the side edge of the chip to protect the leads 12, 14 and 16 from damage during manufacturing of the PCB. It is preferred that, when mounted, the bottom surface of the collar be spaced apart from the surface of the PCB to permit cooling and cleaning of the leads.

Figure 2:
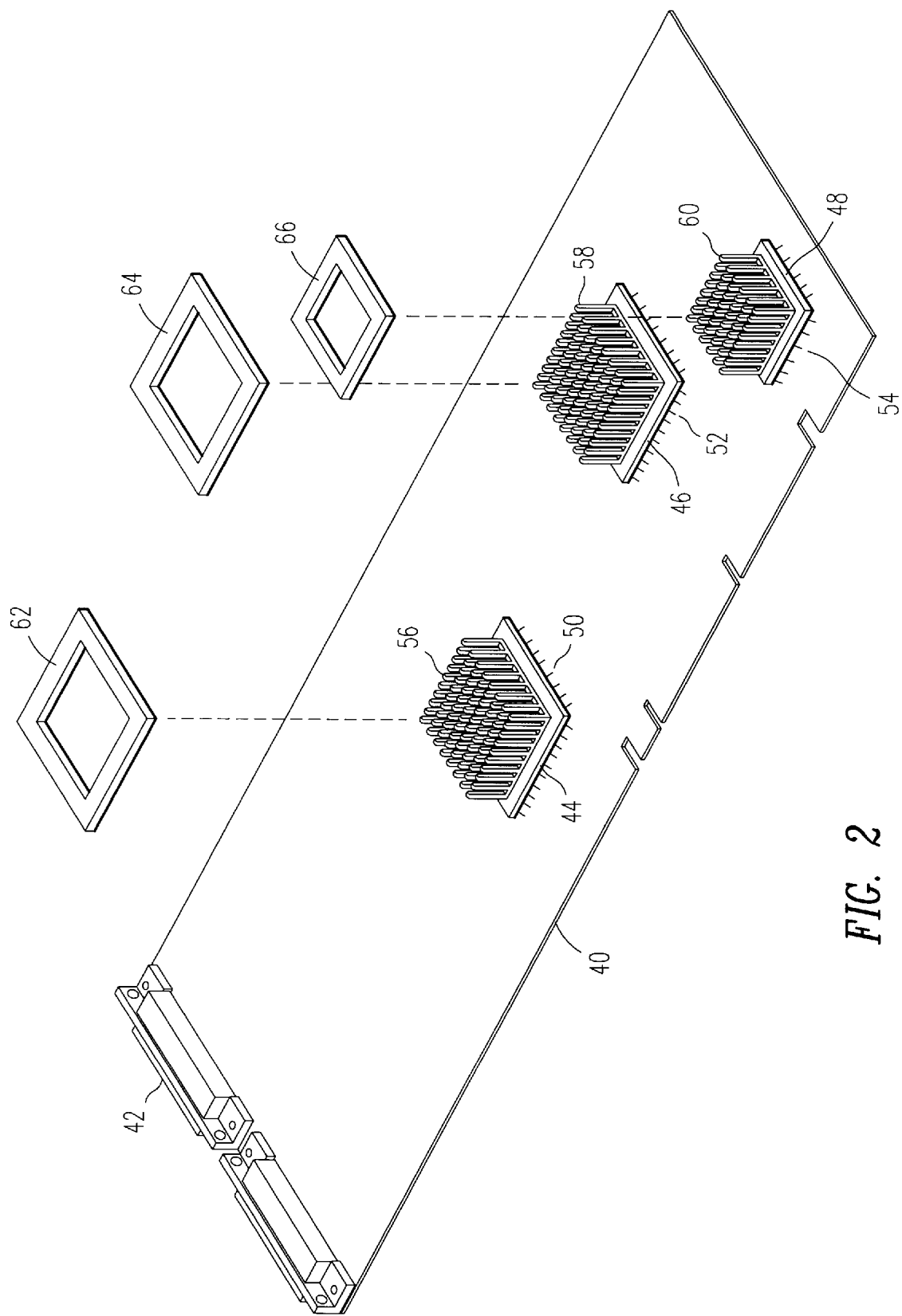
FIG. 2 is a perspective view of an alternative PCB of the present invention having chips with heat sinks.

Referring to FIG. 2, there is shown an alternative embodiment of the PCB of the present invention. The printed circuit board 40 has connector 42 for connecting the PCB to an electronic component. The PCB 40 also has chips 44, 46 and 48 mounted on the PCB (e.g., surface mounted). The chips 44, 46 and 48 have leads 50, 52 and 54, respectively, electrically connecting the chip to the circuit board. The circuit board is provided with a network of circuits (not shown) for providing power to the chips and distributing the input/output signals between the chips and the connector 42. Each chip 44, 46 and 48 is provided with heat sink 56, 58 and 60, respectively. The heat sinks are suitably provided with splines (shown), fins, or other protrusions for dissipating heat from the chip during operation. The heat sinks are mounted on the top surface of the chip. Each chip 44, 46 and 48 is also provided with a collar 62, 64 and 66, respectively. The collars are mounted around the edge of the chip and may be mounted on the chip before or after the heat shield has been attached. The collar extends outwardly from the edge of the chip to protect the leads electrically connecting the chip to the PCB.

Although this invention has been described with respect to specific embodiments, the details thereof are not to be construed as limitations, for it will be apparent that various embodiments, changes and modifications may be resorted to without departing from the spirit and scope thereof; and it is understood that such equivalent embodiments are intended to be included without the scope of this invention.

What is claimed is:

1. A printed circuit board with an attached integrated circuit chip having a plurality of leads running from the chip to the circuit board, the chip having a planar collar frictionally, removably mounted around the chip and extending outwardly from the side of the chip, the collar having a top and bottom planar surface without projections and an aperture for receiving the chip.

2. A printed circuit board with an attached integrated circuit chip, the chip having a planar transparent collar frictionally mounted around the chip and extending outwardly from the side of the chip, the collar having a top and bottom planar surface without projections and an aperture for receiving the chip.

* * * * *